US012154804B2

(12) United States Patent
Rhee

(10) Patent No.: US 12,154,804 B2
(45) Date of Patent: *Nov. 26, 2024

(54) PREDICTIVE WAFER SCHEDULING FOR MULTI-CHAMBER SEMICONDUCTOR EQUIPMENT

(71) Applicant: Applied Materials, Inc., Santa Clara, CA (US)

(72) Inventor: Adrian Rhee, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/493,943

(22) Filed: Oct. 25, 2023

(65) Prior Publication Data

US 2024/0055284 A1 Feb. 15, 2024

Related U.S. Application Data

(63) Continuation of application No. 16/881,370, filed on May 22, 2020, now Pat. No. 11,901,204.

(51) Int. Cl.
*H01L 21/67* (2006.01)
*G05B 19/4155* (2006.01)
*G06N 20/00* (2019.01)

(52) U.S. Cl.
CPC .... *H01L 21/67276* (2013.01); *G05B 19/4155* (2013.01); *G06N 20/00* (2019.01); *G05B 2219/32252* (2013.01)

(58) Field of Classification Search
None
See application file for complete search history.

(56) References Cited

U.S. PATENT DOCUMENTS 6,493,599 B2 12/2002 King
7,904,192 B2 3/2011 Chua
(Continued)

FOREIGN PATENT DOCUMENTS

JP 2000099111 A 4/2000
JP 2013168498 A 8/2013
(Continued)

OTHER PUBLICATIONS

International Search Report and Written Opinion for Application No. PCT/US2021/033747 dated Sep. 10, 2021, 10 pages.
(Continued)

*Primary Examiner* — Jason D Mitchell
(74) *Attorney, Agent, or Firm* — Lowenstein Sandler LLP

(57) ABSTRACT

A method includes identifying a set of wafers, wherein each wafer is associated with a respective start time of a set of start times, determining whether the set of wafers includes an idle wafer, in response to determining that the set of wafers includes an idle wafer that is idle for a duration that exceeds a predefined threshold value, generating a modified set of start times by modifying at least the start time for the idle wafer, and initiating a computer simulation forecasting processing of the set of wafers using a wafer modification chamber and a wafer movement chamber based on the modified set of start times. The computer simulation uses a machine learning model trained based on a first duration to perform a first manufacturing task using the wafer modification chamber and a second duration to perform a second manufacturing task using the wafer movement chamber.

20 Claims, 4 Drawing Sheets

(56) References Cited

U.S. PATENT DOCUMENTS

| | | |
|---|---|---|
| 8,082,045 B1 | 12/2011 | Ashizawa |
| 10,910,060 B1 | 2/2021 | Wu |
| 11,348,017 B1 | 5/2022 | Wong |
| 11,901,204 B2 * | 2/2024 | Rhee .................. G06Q 50/04 |
| 2005/0137734 A1 | 6/2005 | Nieuwelaar |
| 2010/0185480 A1 | 7/2010 | Wang |
| 2016/0307145 A1 | 10/2016 | Banerjee |
| 2017/0255720 A1 | 9/2017 | Satoh |
| 2018/0173823 A1 | 6/2018 | Satoh |
| 2018/0357582 A1 | 12/2018 | Shiho |
| 2019/0034227 A1 | 1/2019 | Suman |
| 2019/0114513 A1 | 4/2019 | Mei |
| 2019/0378039 A1 | 12/2019 | Zamanzad Gavidel |
| 2019/0378050 A1 | 12/2019 | Edkin |
| 2020/0110390 A1 | 4/2020 | Banna |
| 2020/0184028 A1 | 6/2020 | Hsieh |
| 2021/0263505 A1 | 8/2021 | Zheng |
| 2022/0019197 A1 | 1/2022 | Matsunaga |
| 2022/0171373 A1 | 6/2022 | Chau |
| 2022/0206469 A1 | 6/2022 | Feng |
| 2022/0229745 A1 | 7/2022 | Martincic |
| 2022/0284344 A1 | 9/2022 | Ma |
| 2022/0296924 A1 | 9/2022 | Peltola |

FOREIGN PATENT DOCUMENTS

| | | |
|---|---|---|
| JP | 2019083309 A | 5/2019 |
| KR | 1999-0039062 | 6/1999 |
| KR | 100957401 B1 | 5/2010 |
| KR | 2013-0141743 | 12/2013 |
| WO | 2019246588 A1 | 12/2019 |
| WO | 2020205339 A1 | 10/2020 |

OTHER PUBLICATIONS

PCT Notification Concerning Transmittal of Copy of International Preliminary Report on Patentability for PCT Application No. PCT/US2021/033747, mailed Dec. 1, 2022.

What is a Gantt Chart?, <https://www.Gantt.com> as archived by the WebArchive project on Apr. 25, 2019. (Year: 2019).

* cited by examiner

PREDICTIVE WAFER SCHEDULING FOR MULTI-CHAMBER SEMICONDUCTOR EQUIPMENT

CROSS-REFERENCE TO RELATED APPLICATION(S)

The present application is a continuation of U.S. patent application Ser. No. 16/881,370, filed on May 22, 2020 and entitled "PREDICTIVE WAFER SCHEDULING FOR MULTI-CHAMBER SEMICONDUCTOR EQUIPMENT", the entire contents of which are incorporated by reference herein.

TECHNICAL FIELD

The present disclosure relates to predictive modeling, and, more particularly, to a simulation based optimization technique for scheduling manufacturing resources.

BACKGROUND

Manufacturing involves the creation of products using steps that may include human labor, machines, or a combination thereof. The manufacturing steps may be associated with settings that determine when, where, or how the steps are performed and effect the products being manufactured. Process engineers typically schedule manufacturing resources that are used to perform the manufacturing steps and the schedule may be based on their industry experience and past experiments.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a method includes determining, by a processing device, resources of a manufacturing tool, wherein the resources comprise a first chamber and a second chamber; accessing task data indicating a first manufacturing task and a second manufacturing task; determining a duration to perform the first manufacturing task using the first chamber and a duration to perform the second manufacturing task using the second chamber; updating a machine learning model based on the duration to perform the first manufacturing task and the duration to perform the second manufacturing task; performing, by the processing device, a set of computer simulations that uses the machine learning model and the task data to produce a set of simulation results; storing, by the processing device, a simulation result of the set of simulation results in a data store.

In another aspect of the disclosure, a system includes a memory and a processing device coupled to the memory. The processing device is to determine resources of a manufacturing tool, wherein the resources comprise a first chamber and a second chamber; access task data indicating a first manufacturing task and a second manufacturing task; determine a duration to perform the first manufacturing task using the first chamber and a duration to perform the second manufacturing task using the second chamber; update a machine learning model based on the duration to perform the first manufacturing task and the duration to perform the second manufacturing task; perform a set of computer simulations that uses the machine learning model and the task data to produce a set of simulation results; store a simulation result of the set of simulation results in a data store.

In yet another aspect of the disclosure, a non-transitory machine-readable storage medium storing instructions which, when executed, cause a processing device to perform operations involving: accessing the machine learning model to forecast the processing of a set of wafers; performing a first computer simulation using a set of start times for the set of wafers; detecting at least one wafer of the set is idle for a duration that exceeds a predefined threshold value; modifying the set of start times to include a different start time for the at least one wafer; and performing a second computer simulation using the modified set of start times.

In an aspect of the disclosure, a method includes identifying, by at least one processing device, a set of wafers, wherein each wafer of the set of wafers is associated with a respective start time of a set of start times, determining, by the at least one processing device, whether the set of wafers includes an idle wafer that is idle for a duration that exceeds a predefined threshold value, in response to determining that the set of wafers includes an idle wafer that is idle for a duration that exceeds a predefined threshold value, generating, by the at least one processing device, a modified set of start times by modifying at least the start time for the idle wafer, and initiating, by the at least one processing device, a computer simulation forecasting processing of the set of wafers using a wafer modification chamber and a wafer movement chamber based on the modified set of start times to obtain a first simulation result, wherein the computer simulation uses a machine learning model trained based on a first duration to perform a first manufacturing task using the wafer modification chamber and a second duration to perform a second manufacturing task using the wafer movement chamber.

In another aspect of the disclosure, a system includes a memory and a processing device communicably coupled to the memory. The processing device is to identify a set of wafers, wherein each wafer of the set of wafers is associated with a respective start time of a set of start times, determine whether the set of wafers includes an idle wafer that is idle for a duration that exceeds a predefined threshold value, in response to determining that the set of wafers includes an idle wafer that is idle for a duration that exceeds a predefined threshold value, generate a modified set of start times by modifying at least the start time for the idle wafer, and initiate a computer simulation forecasting processing of the set of wafers using a wafer modification chamber and a wafer movement chamber based on the modified set of start times to obtain a first simulation result, wherein the computer simulation uses a machine learning model trained based on a first duration to perform a first manufacturing task using the wafer modification chamber and a second duration to perform a second manufacturing task using the wafer movement chamber.

In yet another aspect of the disclosure, a non-transitory machine-readable storage medium storing instructions which, when executed, cause a processing device to perform operations including: identifying a set of wafers, wherein each wafer of the set of wafers is associated with a respective start time of a set of start times, determining whether the set of wafers includes an idle wafer that is idle for a duration that exceeds a predefined threshold value, in response to determining that the set of wafers includes an idle wafer that is idle for a duration that exceeds a predefined threshold value, generating a modified set of start times by modifying at least the start time for the idle wafer, and initiating a computer simulation forecasting processing of the set of wafers using a wafer modification chamber and a wafer movement chamber based on the modified set of start times to obtain a first simulation result, wherein the computer simulation uses a machine learning model trained based on a first duration to perform a first manufacturing task using the wafer modification chamber and a second duration to perform a second manufacturing task using the wafer movement chamber.

BRIEF DESCRIPTION OF THE DRAWINGS

The present disclosure is illustrated by way of example, and not by way of limitation in the figures of the accompanying drawings.

DETAILED DESCRIPTION

Figure 1:
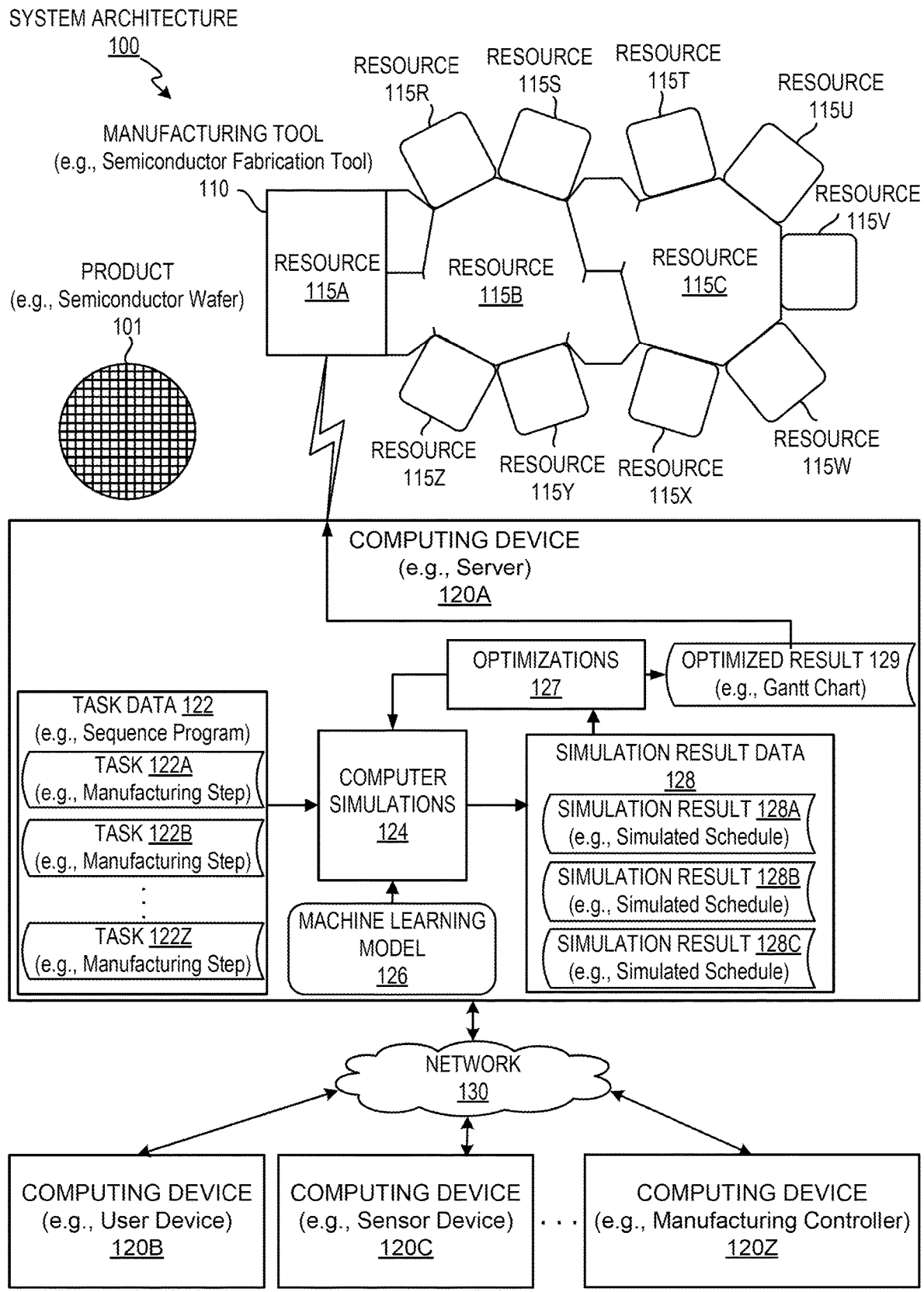
FIG. 1 is a block diagram illustrating an exemplary system architecture, according to certain embodiments.

Manufacturing processes continue to increase in complexity and often involve many tasks that are performed to create a manufactured product. The tasks may be performed by a single tool or one or more tools. Each task may require one or more resources of the tool to complete the task and a resource conflict may occur when a set of products are attempting to use the same resource. To address the conflict, a tool may schedule one or more of the products to occupy the resource and may make the remaining products wait in a queue until the resource becomes available. Queuing the products may reduce the throughput of the tool and in some situations may reduce the quality of the products. For example, manufactured products may be the result of many tasks and variations in the times the product are idle between tasks may introduce variations to the finished product. This may arise because the variations between the tasks may alter the properties of the product. Changes to thermal, moisture, texture, or other property may adversely affect current or subsequent tasks and may reduce the quality of the finished product.

Aspects of the present disclosure address the above and other deficiencies by providing technology that uses machine learning and computer simulations to optimize resource scheduling for a manufacturing process. In one example, the technology may be embedded within a manufacturing tool that can perform multiple tasks sequentially or parallel on a series of products. The products may be semiconductor wafers and the manufacturing tool may have multiple chambers that can each perform a task on one of the semiconductor wafers. In one example, the technology may involve a computing device determining the resources of the manufacturing tool, which may include a layout and capabilities of a set of chambers that can each hold one or more products (e.g., wafers). The technology may access task data that indicates a sequence of manufacturing tasks that the manufacturing tool can perform on the one or more products. Each task may be associated with a recipe for performing the task and may use a particular chamber of the manufacturing tool.

The technology may track how long the manufacturing tool takes to perform different manufacturing tasks using the different resources. For example, different resources may have different product capacities, load times, modification times, clean times, or a combination thereof. The technology may train a machine learning model to model the temporal aspects of the manufacturing tool based on the tracked times. The technology may then perform a set of computer simulations that uses the machine learning model and the task data to produce a set of simulation results. Each of the simulation results may be a schedule for the manufacturing tool that indicates the order in which the resources perform the tasks on a set of products. The technology may then calculate optimization values based on the simulation results and select one of the simulation results based on the optimization values. The optimization values may be specific to a set of one or more tasks and may be based on product idle time (e.g., wafer idle time between tasks), resource utilization (e.g., chamber idle time), tool throughput, other performance metric, or a combination thereof.

Systems and methods described herein include technology that enhances one or more manufacturing tools used in a manufacturing process. In particular, aspects of the present disclosure may enhance the quality of manufactured products by reducing variations in product idle time during the manufacturing process. This may increase the consistency of manufactured products. The technology may also increase the utilization and/or throughput of the manufacturing tool or of particular resources of the manufacturing tool.

Various aspects of the above referenced technology are described in details herein below by way of examples, rather than by way of limitation. The examples provided below discuss a computing device that is communicatively coupled with a manufacturing tool. In other examples, the computing device may not be communicatively coupled to the manufacturing tool and may access data associated with the manufacturing tool from a data store and may generate data that can be subsequently used by a user or device to configure the manufacturing tool.

FIG. 1 is a block diagram illustrating an exemplary system architecture 100, according to certain embodiments. The system architecture 100 may be used to optimize a manufacturing process that may provide or produce one or more products 101. Product 101 may be for use or sale and may be a tangible or intangible object, good, service, other product, or a combination thereof. A tangible product may be touched by a human and may include physical products, goods, elements, or other object (e.g., etched wafer, semiconductor device, microchip, or other electronic device). Intangible products may be perceived directly or indirectly by a human without being touched and may include circuit designs, device layouts, manufacturing recipes, tool configuration, computer programs, services, other intangible element, or a combination thereof. In the example shown in FIG. 1, system architecture 100 may include a manufacturing tool 110 and one or more computing devices 120A-Z.

Manufacturing tool 110 may be any tool that contributes to a manufacturing process that produces product 101. The tool may be a machine, a computing device, a computer program, other device, or a combination thereof. Manufacturing tool 110 may include computer software (e.g., program code) and computer hardware (e.g., integrated circuits) and may be used for semiconductor device fabrication.

Semiconductor device fabrication may involve the manufacture of semiconductor devices and integrated circuits (ICs). Manufacturing tool 110 may perform a multiple-step sequence that may include photolithographic and chemical processing steps (such as surface passivation, thermal oxidation, planar diffusion and junction isolation) during which electronic circuits are gradually created on a product made of a semiconducting material (e.g., silicon wafer). Manufacturing tool 110 may process product 101 using one or more resources 115A-Z.

Resources 115A-Z may be different portions of manufacturing tool 110 and may each be the same or similar to a partition, area, section, region, part, or other portion of manufacturing tool 110. In one example, each of the resource 115A-Z may be a chamber for performing one or more tasks on product 101. A chamber may hold one or more products and may be the same or similar to an enclosure, a compartment, a container, an opening, a vessel, a receptacle, a storage unit, a housing, or a combination thereof. Resources 115A-Z may include one or more different types of resources that can be used to process a product. Processing a product may involve performing an action that involves the product and may include one or more operations to load a product, transfer a product, modify a product, other operation, or a combination thereof.

In the example shown in FIG. 1, resources 115A-C may be configured to move products into manufacturing tool 110 or within manufacturing tool 110. Resource 115A may be an external transfer resource that includes a port and a robotic component to load one or more products 101 into manufacturing tool 110 from a transport device that is external to manufacturing tool 110. The transport device may transport a set of one or more products to a manufacturing tool, from a manufacturing tool, or between manufacturing tools. The transport device may be a pod that has an enclosure for securely storing a set of one or more products and may be the same or similar to a Front Opening Unified Pod (FOUP). Resources 115B-C may be internal transfer resources that are capable of storing products and transferring the products within manufacturing tool 110. The transfer resources may transfer a product into a resource, out of a resource, between resources, or a combination thereof. The internal and external transfer resources may be chambers with electro-mechanical actuators (e.g., robots) that can move wafers into and out of different chambers and may be referred to as robotic chambers. Resources 115R-Z may be portions of the manufacturing tool 110 that are capable of modifying product 101 in view of tasks 122A-Z. Each resource may be configured to perform a particular task (e.g., task 122A) or a set of multiple tasks (e.g., tasks 122B-C).

Tasks 122A-Z may correspond to manufacturing steps that are performed by manufacturing tool 110 to produce product 101. In one example, tasks 122A-Z may be semiconductor fabrication tasks and may include wafer cleaning (e.g., wet cleaning), photolithography, ion implantation, etching (e.g., wet etching, dry etching, atomic layer etching), plasma ashing, thermal treatment (e.g., annealing, thermal oxidization), vapor deposition (e.g., chemical vapor deposition (CVD), atomic layer deposition (ALD), physical vapor deposition (PVD)), molecular-beam epitaxy (MBE), polishing (e.g., chemical-mechanical polishing), measuring (e.g., wafer or die measurement), testing (e.g., wafer or IC testing), back grinding, dicing, bonding, encapsulation, other task, or a combination thereof. Tasks 122A-Z may be associated with task data 122.

Task data 122 may identify the tasks and a sequence that the tasks can be performed in to produce product 101. Task data 122 may be referred to as sequence data, a sequence program, a recipe, or other term. Task data 122 may be provided by an entity designing the product to an entity manufacturing the product and the entities may be part of the same or different business entities. The entity designing the product may indicate a beginning task, one or more intermediate tasks, and an ending task. One or more of the tasks may be performed serially or in parallel on a particular product or on different products in a set (e.g., different wafers in a pod).

Task data 122 may include input data, output data, or a combination thereof for one or more of tasks 122A-Z. The input data for a task may include any data that defines one or more inputs for a manufacturing step. For example, input data may indicate one or more attributes of input products, configurations, settings, or other data. The input data may be the same or similar to parameter data, settings data, configuration data, other data, or a combination thereof. The input data may include one or more values that indicate how the manufacturing process will be performed (e.g., parameter values, setting values, configuration values). In one example, the input data may include one or more values corresponding to time (e.g., deposition time, etch time, oxidation time, implantation time, cleaning time), energy (e.g., temperature, current, voltage, electromagnetic frequency), input rate (e.g., gas flow rate, wafer spin speed), distance (e.g. space between substrate and tool, feature width, height, depth), pressure (e.g., Pascal, bar), input substance (e.g., precursor, reactant, dilutant), other attribute or property, or a combination thereof.

The output data may be any data that describes expected outputs of a manufacturing step. Output data may describe one or more attributes of product 101, by-products, other output, or a combination thereof. The output data may include values that indicate an actual attribute of product before, during, or after the step is performed. The attributes may correspond to one or more measurements of product 101. The measurements may be related to dimensions (e.g., length, width, height, depth, thickness, radius, diameter, area, volume, size), material property (e.g., reflectivity, emissivity, absorptivity, conductivity, density, texture), uniformity (e.g., film thickness uniformity), location (e.g., relative or absolute position), other attribute, or a combination thereof. In one example, the output data may indicate the attributes of product 101 in the form of an N-point metrology, wherein N indicates the number of reference measurements for the product (e.g., 49 point metrology). The N-point metrology may provide critical dimensions for one or more electronic components of a semiconductor product (e.g., dimensions of transistor or via).

Computing devices 120A-Z may include one or more computing devices that are associated with manufacturing tool 110. Computing devices 120A-Z may include an embedded system, a server, a workstation, a personal computer, a laptop computer, a tablet computer, a mobile phone, a palm-sized computing device, a personal digital assistant (PDA), etc. Computing devices 120A-Z may include computing devices implemented with x86 hardware (e.g., Intel® or AMD®), PowerPC®, SPARC®, or other hardware.

One or more of the computing devices 120A-Z may function as manufacturing control devices, sensor devices, user devices, other devices, or a combination thereof. A manufacturing control device (e.g., controller) may control a portion of the manufacturing tool 110 and may access, generate, or transmit input data, output data, or a combination thereof. A sensor device (e.g., sensor) may be capable of perceiving an aspect of manufacturing tool 110 or an aspect of product 101 and may involve a measurement component that is capable of measuring an attribute of the manufacturing tool 110 or product 101. In one example, the sensor device may include an image capturing module or an acoustic capturing module. User devices may be the same or similar to a client device and may provide a user interface for a user (e.g., process engineer). The user interface may present (e.g., display and/or announce) information to a user and may include one or more control elements for gathering user input. One or more of computing devices 120A-Z may run computer simulations 124 using a machine learning model 126.

Machine learning model 126 may mathematically model the durations of time that manufacturing tool 110 consumes to perform tasks. In one example, machine learning model 126 may be a single machine learning model that models manufacturing tool 110. In another example, machine learning model 126 may include a set of machine learning models and each model of the set may model one or more resources. In either example, each machine learning model may be the same or similar to a mathematical model, statistical model, neural network, other mathematical representation, or a combination thereof. Machine learning model 126 may include mathematical data that represents relationships between model input (e.g., tasks and/or resources) and model output (e.g., time durations). The mathematical data may include one or more matrices, indexes, value pairs, vectors, functions, equations, expressions, operators, operands, coefficients, variables, weights, biases, links, other data, or a combination thereof.

In one example, machine learning model 126 may be a data structure that includes one or more matrices that represent mathematical relationships. Each matrix may include one or more dimensions and may correlate a particular manufacturing task and/or resource to one or more durations of time. The matrix may include a single dimension (e.g., list), two dimensions (e.g., table), or three or more dimensions (e.g., 3D table). Each element of the matrix may correspond to a time duration and the location of the element in the matrix may indicate the corresponding task and/or resource. For example, a first axis (e.g., rows) may correspond to the resources and a second axis (e.g., columns) may correspond to the tasks and an intersection of a point on each axis may identify an element (e.g., time duration). The element may include one or more values that are based on the time duration the manufacturing tool took to perform the task using the resource. The one or more values may be based on historical values, maximum values, minimum values, average values, aggregate values, other numeric or statistical values, or a combination thereof.

In another example, machine learning model 126 may be a data structure that includes one or more mathematical functions that represent the mathematical relationships. The mathematical function may include a variable that corresponds to a resource and a variable that corresponds to the task and the output of the mathematical function may correspond to a time duration. In either example, machine learning model 126 may be an artifact of a machine learning process that analyzes training data and creates a model that represents relationship patterns and inferences derived from the training data.

The training data may include time series data that is based on historical or experimental runs of manufacturing tool 110. In one example, machine learning model 126 may include one or more regression models for analyzing task data 122 and deriving one or more durations of time. In another example, machine learning model 126 may include one or more neural networks that are trained using a deep learning technique and may include multiple layers. A neural network may be referred to as an artificial neural network (ANN), a network, a model, or other term. The neural network may be the same or similar to a Recurrent Neural Network (RNN), a Feed Forward Neural Networks (FFNN), a Multi-Layer Perceptron Neural Network (MLP), a Fully Connected Neural Network, a Radial Basis Function Neural Network (RBF), a Modular Neural Network, a Kohonen Self Organizing Neural Network, a Modular Neural Network, Convolutional Neural Network (CNN), other network, or a combination thereof. In either example, machine learning model 126 may be used perform performing computer simulations 124.

Computer simulations 124 may represent a computer simulation engine that executes a set of computer simulations to identify an optimized schedule. Each of computer simulations 124 may involve using machine learning model 126 to predict future values for manufacturing tool 110 based on previously observed values of one or more manufacturing tools. The prediction of future values may be referred to as time series forecasting and may involve time series analysis. In one example, each computer simulation may involve simulating the manufacturing tool 110 to identify a manufacturing schedule.

The manufacturing schedule may be based on a set of start times for the set of products and the computer simulation may iterate through the tasks for each product to populate the manufacturing schedule. A first task iteration may determine when a first product will be processed by each of the respective resources. The second task iteration may determine when a second product will be processed by each of the respective resources. The second iteration may account for resource conflicts and may delay the second product from being processed until after a resource finishes processes the first product. Manufacturing tool 110 may include multiple resources that can perform the same task and the second iteration may indicate the second product is processed by schedule by one of the other resources. The iterations may occur for each product until all the products are scheduled for processing. Earlier computer simulations may have the products start at the same time and that may result in products that have different wait times within the manufacturing tool (e.g., wafer idle time between tasks). Subsequent computer simulation may use different start times that cause subsequent products to wait to be loaded by the manufacturing tool but have little to no wait time once the manufacturing tool begins to process them. The subsequent computer simulations may identify a manufacturing schedule that reduces resource conflicts and product idle times. The computer simulations 124 may output the manufacturing schedules in the form of simulation result data 128.

Simulation result data 128 may include one or more simulation results 128A-C, which may each be the output of a computer simulation and may represent one or more manufacturing schedules. A manufacturing schedule may be represented as a set of one or more timelines that are organized by resource (e.g., resource schedule), by product (e.g., product schedule), by task (e.g., task schedule), other element, or a combination thereof. In one example, the simulation result may be organized by resource and each timeline may correspond to a respective resource (e.g., respective chamber) and may include time blocks that indicate when the resource processes each of the products (e.g., all the wafers modified by a particular chamber). In another example, the simulation result may be organized by product and each timeline may correspond to a respective product (e.g., respective wafers) and may include time blocks that indicate when and where the product was processed (e.g., all the chambers that processed a particular wafer). In either example, the manufacturing schedules may be represented as a series of time values and may be analyzed via optimizations 127 to identify optimized results 129, as discussed in more detail below in regards to FIG. 2.

Figure 2:
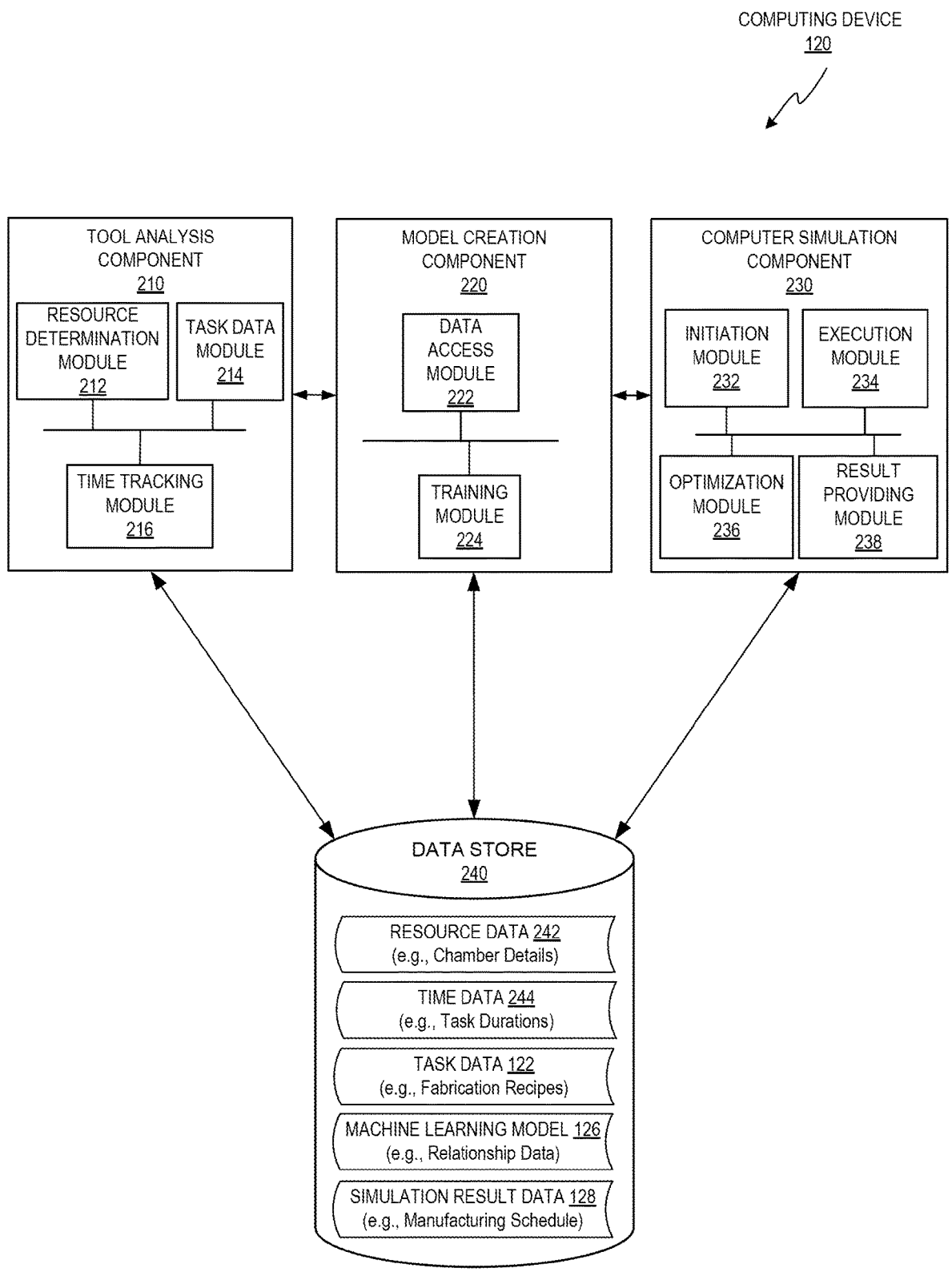
FIG. 2 is an example computing device, according to certain embodiments.

FIG. 2 depicts a block diagram illustrating an exemplary computing device 120 that includes technology to perform simulation based optimizations for a manufacturing tool, in accordance with one or more aspects of the present disclosure. Computing device 120 may be the same or similar to one or more of computing devices 120A-Z of FIG. 1. The components and modules discussed herein may be performed on a single computing device or on multiple different computing devices. In one implementation, one or more of the components may reside on different computing devices (e.g., model training on a first computing device and computer simulations on a different computing device). More or less components or modules may be included without loss of generality. For example, two or more of the components may be combined into a single component, or features of a component may be divided into two or more components. In the example shown in FIG. 2, computing device 120 may include a tool analysis component 210, a model creation component 220, and a computer simulation component 230.

Tool analysis component 210 may enable computing device 120 to analyze the manufacturing tool to determine the resources and capabilities of manufacturing tool. The analysis may occur before the manufacturing tool is shipped to a customer or may occur after the manufacturing tool is shipped to the customer and in either example may occur before, during, or after, an initialization of the manufacturing tool. The initialization may be the same or similar to a hardware initialization (e.g., system startup, BIOS), a software initialization (e.g., Operation System (OS) boot, program startup), other initialization, or a combination thereof. In one example, tool analysis component 210 may include a resource determination module 212, a task data module 214, and a time tracking module 216.

Resource determination module 212 may determine the resources and resource capabilities of the manufacturing tool by accessing one or more data storage objects, by communicating with one or more resources, or a combination thereof. As discussed above, the resources may include one or more areas, sections, or chambers of the tool that can be used to process a manufactured product (e.g., move or modify a wafer). The data storage objects may store data that indicates one or more of the resources of one or more manufacturing tools and the data may be referred to as resource data or tool data. The data storage objects may include one or more file objects (e.g., files, directories), database objects (e.g., records, tuples, value pairs), Binary Large Objects (BLOBs), other data structures, or a combination thereof. Resource determination module 212 may also or alternatively determine the resources by communicating with one or more of the resources. The communication may be the same or similar to scanning or querying each of the resources and may involve transmitting requests and receiving responses with data indicating the resources of the manufacturing tool. Resource determination module 212 may store the data in data store 240 as illustrated by resource data 242.

Resource data 242 may include identification data, layout data, capability data, other data, or a combination thereof. The identification data may enable computing device 120 to uniquely identify a resource and may include one or more identifiers of the resources (e.g., resource identifiers, universally unique identifiers (UUID), a globally unique identifiers (GUID)). Layout data may indicate the location of a resource with respect to the tool or with respect to another resource. The layout data may enable resource determination module 212 to determine the layout of the manufacturing tool. The layout may indicate the location (e.g., relative location) of a resource with respect to one or more other resources or with respect to the tool. The location of the resource may be used to determine the time it takes to move a product between resources. The capability data may in indicate the capabilities of the resource, which may include the type of resource (e.g., modification chamber, movement chamber) and one or more tasks that the resource can perform.

Task data module 214 may access task data that identifies the tasks for manufacturing the product. The task data may identify the steps and an order of the steps that manufacturing tools perform on the product. Task data module 214 may enable computing device 120 to receive the task data via user input, a data storage object, or combination thereof. In one example, the task data may be a sequence program that is stored in a centralized data store that is accessible over a network (e.g., recipe repository, sequence repository). Task data module 214 may receive (e.g., download) the task data and store it as task data 122 in data store 240. In one example, task data 122 may include a sequence of recipes to process a wafer and each recipe may correspond to a respective chamber of the manufacturing tool.

Time tracking module 216 may enable computing device 120 to determine how long the manufacturing tool takes to perform different tasks. The tasks may be any processing task and may involve tasks that modify a resource (e.g., pre-clean or post-clean a resource), modify a product (e.g., photolithography, etch), move a product (e.g., load into tool or transfer in or out of a resource), or a combination thereof. In one example, time tracking module 216 may be used to monitor the manufacturing tool during the processing of one or more products. In another example, the manufacturing tool may record (e.g., log) time durations during the processing of the one or more products and time tracking module 216 may access the recorded times. In either example, time tracking module 216 may be modify, aggregate, filter, or supplement the time durations before, during, or after being stored as time data 244 in data store 240.

Time data 244 may indicate the durations of time that the manufacturing tool consumes to perform tasks. Time data 244 may include an entry (e.g., log entry) that indicates one or more times (e.g., start time, end time, and/or duration), resources (e.g., loading chamber A, modification chamber Z), products (e.g., wafer identifier, pod identifier), tasks (e.g., sequence identifier, recipe identifier), tools (e.g., manufacturing tool 110), other data, or a combination thereof. In one example, time data 244 may be generated while a plurality of wafers are processed by a particular manufacturing tool and may indicate a plurality of wafer load times, processing times of the first chamber, processing times of the second chamber, and transfer times between chambers.

Model creation component 220 may use time data 244 to train a machine learning model 126 to model the manufacturing tool. In one example, model creation component 220 may include a data access module 222 and a training module 224.

Data access module 222 may access data that is associated with the manufacturing tool and can be used to train a machine learning model. The data may be referred to as training data and may include or be derived from any data in data store 240, such as, time data 244, resource data 242, task data 122, other data, or a combination thereof. Data access module 222 may access the training data directly or indirectly from the manufacturing tool. Accessing the training data directly from the manufacturing tool may involve accessing the training data from a communication channel or data store of the manufacturing tool. Accessing the training data indirectly from the manufacturing tool may involve accessing the training data from a data store that is separate from the manufacturing tool (e.g., from a log server). Data access module 222 may perform one or more processing operations on the accessed data before using it as training data. The processing may be referred to as pre-processing or post-processing and may involve one or more operations to correlate, normalize, add, remove, aggregate, filter, sterilize, anonymize, or other operation.

The training data may include or be based on historical data, simulated data, augmented data, other data, or a combination thereof. The historical data may be derived from one or more physical executions of the manufacturing process and the physical executions may be for commercial use, test use, experimental use, research and development use, other use, or a combination thereof. Augmented data may be based on historical data that is manipulated to include a variation that may or may not be present in the data being manipulated. The variation may alter the data using one or more mathematical transformations (e.g., reduce or increase durations based on recipe modifications).

Training data may include labeled data, unlabeled data, or a combination thereof. Labeled data may include primary data (e.g., a time duration) that is supplemented with auxiliary data (e.g., resource or product label). The auxiliary data be a tag, annotation, link, label, or other data. Unlabeled data may be data that is absent labels (e.g., missing labels, free of labels, without labels). The unlabeled data may be stored without labels and may or may not remain unlabeled prior to being accessed by training module 224.

Training module 224 may enable computing device 120 to analyze training data and create one or more machine learning models 126. Training module 224 may create new machine learning models or update existing machine learning models. Training a machine learning model may involve using one or more training techniques that are proprietary, standardized, open source, or a combination thereof. In one example, training module 224 may analyze the training data and identify one or more time durations for each combination of resource and task. For example, training module 224 may identify a duration of time (e.g., average duration, maximum duration, most recent duration) that a resource consumes to perform each applicable task. In another example, training module 224 may provide the training data to a training framework that creates the machine learning model 126. The training framework may be the same or similar to Tensorflow™, Keras™, PyTorch™, Open Neural network Exchange (Onnx™), Cognitive Toolkit (CNTK), Azure Machine Learning Service, Create ML, other machine learning framework, or a combination thereof.

Training module 224 may store the results of the training as machine learning model 126 in data store 240. The machine learning model 126 may be stored as one or more file objects (e.g., files, directories, links), database objects (e.g., records, tuples), other storage objects, or a combination thereof. Data store 240 may be a memory (e.g., random access memory), a drive (e.g., a hard drive, a flash drive), a database system, or another type of component or data storage device capable of storing data. Data store 240 may include multiple storage components (e.g., multiple drives or multiple databases) that may span multiple computing devices (e.g., multiple server computers). Machine learning model 126 may be transmitted to one or more other data stores or computing devices and made accessible to computer simulation component 230.

Computer simulation component 230 may enable computing device 120 to perform a set of computer simulations that use the machine learning model 126 and task data 122 to produce a set of simulation results. Each simulation result may include a schedule for the resources that are used to process the products and may indicate the times that each resource processes the one or more products. The schedule may be used for a future execution of the manufacturing tool or for a current execution of the manufacturing tool. For example, input from a current execution (e.g., delay of resource X) may be used to update a model and simulate the remaining tasks to identify a revised schedule. The revised schedule may then be used may the manufacturing tool to alter the execution of subsequent tasks. This revisions to the schedule may be done in real time with little to no delay of a manufacturing process (e.g., no need to stop or restart the manufacturing tool). In the example of FIG. 2, computer simulation component 230 may include an initiation module 232, an execution module 234, an optimization module 236, and a result providing module 238.

Initiation module 232 may initiate one or more of the computer simulations using simulation inputs. The simulation inputs may include machine learning model 126 and model input. The model input may be based on task data 122, resource data 242, product quantity data, user input data, other data, or a combination thereof. The model input may be in the form of or more input vectors that identify the tasks and/or resources that correspond to a product. Each product of a set may be associated with the same product vector or different product vectors. The model input may also include a set of start times that indicate when the manufacturing tool will begin processing the one or more of the products. The machine learning model 126 may be accessed from a local storage device, a remote storage device, or a combination thereof. In one example, initiation module 232 may receive machine learning model 126 from a local storage location (e.g., data store 240), which may occur when computing device 120 created the machine learning model or when the machine learning model is created by another computing device and is installed, packaged, downloaded, uploaded, or transmitted to computing device 120. In another example, initiation module 232 may access machine learning model 126 over a computer network 130 from a server on the same network or on a different network (e.g., internet), which may enable a customer to receive machine learning model 126 or an update to the model from a third party (e.g., manufacturing tool creator or distributor).

Execution module 234 may enable computing device 120 to execute a set of computer simulations sequentially, in parallel, or a combination thereof. During an execution of a computer simulation, execution module 234 may detect one or more resource conflicts. A resource conflict may arise when a product (e.g., second product) is waiting for a resource to finish processing another product (e.g., first product). Execution module 234 may address the conflict by adjusting the start times of one or more of the products, which may involve adjusting the start time of the first product to be earlier (e.g., expediting) or adjusting the start time of the second product to be later (e.g., delaying), or a combination thereof. The adjusted times may be incorporated into the simulation results.

Each simulation result may represent a set of one or more timelines that may be organized or arranged by resource or product. In one example, the time lines may be organized by resource and each of the timelines may correspond to a respective resource and may indicate when the resource processes each product (e.g., all the wafers modified by the respective chamber). In another example, the time lines may be organized by product and each of the timeline may correspond to a respective product and may indicate when and where the product is processed (e.g., all the chambers that processed the respective wafer). In either example, a simulation result may be represented as a set of output vectors.

An output vector may be a data structure that stores time series data and may represent a timeline for a particular resource (e.g., chamber), a particular product (e.g., wafer), a particular tool, other item, or a combination thereof. Each output vector may include time data, resource data, task data, or other data. The set of output vectors may include one or more resource vectors (e.g., chamber vectors) that correspond to specific resources or product vectors (e.g., wafer vectors) that correspond to specific manufactured products. In one example, the output vectors may be a set of resource vectors that each correspond to a particular resource of the manufacturing tool (e.g., a chamber). The resource vector may include time series data that includes a plurality of time values and product identifiers. The time series data may indicate multiple products that are processed by the resource and the time the products are processed (e.g., start time, end time, duration). In another example, the output vectors may be a set of product vectors that each correspond to a particular product manufactured by the manufacturing tool (e.g., a wafer). The product vector may include time series data that includes a plurality of time values and resource identifiers that indicate the multiple resources that process the product and the time the resource process the product.

Optimization module 236 may analyze the simulation results and calculate optimization values for the simulation results. The optimization value may be based on one or more products, resources, tools, or a combination thereof. For example, the optimization values may be based on product idle times (e.g., maximum wafer idle time), resource utilizations (e.g., chamber utilization rate), tool throughput (e.g., wafers per hour), other value, or a combination thereof. The optimization value may also or alternatively be based on one or more particular tasks. For example, the optimization value (e.g., product idle time) may be based on a time before, during, or after the particular task or set of tasks. This may be particularly advantageous when some of the tasks performed by the manufacturing tool on the product may be time dependent (e.g., time sensitive photolithography task). The time dependent variations across different products of a set may cause the manufactured products to vary in a manner that exceeds a predefined threshold (e.g., threshold value of thermal loss).

In one example, optimization module 236 may use the set of output vectors to determine the optimization value, such as an idle time of a product. The idle time may be based on one or more durations of time that the product waits for a resource conflict to be resolved (e.g., a resource to become available) and may include a duration before, during, or after a task is performed. The or more durations may include a duration before the product is loaded into the manufacturing tool from a transportation device, a duration in a storage resource (e.g., wafer buffer or queue), other duration, or a combination thereof. As discussed above, the output vectors may include multiple time values and the time values can be compared to determine the idle time of a wafer. When the output vectors are product vectors the idle time for a particular product can be determined by analyzing a single product vector. When the output vectors are resource vectors the idle time for a particular product may be determined by analyzing resource vectors for every resource that processes the particular product. In either example, determining the optimization value (e.g., idle time) may be performed by comparing time values of one or more of the output vectors.

Optimization module 236 may compare the optimization values of different computer simulations. The optimization value of a simulation result may be compared to one or more optimization values of the set of simulation results. The comparison may be a mathematical comparison that determines one or more differences between optimization values. The differences may be weighted and/or aggregated before or after the comparison. In one example, optimization module 236 may select the simulation result from the set of simulation results based on the comparison of optimization values (e.g., select the simulation result with the highest value or lowest value). In another example, optimization module 236 may determine whether to execute one or more additional computer simulations based on a comparison. This may involve determining whether the additional simulations are identifying more optimal solutions (e.g, schedules with less idle time). When subsequent simulation results are more optimized or substantially more optimized (e.g., optimization value difference above a threshold value) optimization module 236 may communicate with initiation module 232 to perform one or more computer simulations. When subsequent simulations results are less optimized or are nominally optimized (e.g., below a threshold value) optimization module 236 may not perform additional computer simulations and may select an optimized result 129 from the existing set of simulation results.

In one example, the output of a computer simulation may be used to determine the input of a subsequent computer simulation. For example, a first computer simulation may produce a resource schedule in which the last manufactured product is idle during an intermediate step. The duration of the idle time may be used to adjust the start time of the product in a subsequent computer simulation. For example, a simulation result may indicate product x was idle for duration y after task n. (e.g., fifth wafer delayed for 90 seconds) and the input for a subsequent computer simulation may delay the start time of product x for a duration of n. In another example, the initiation module may produce multiple different sets of product start times and may use each as input to computer simulations that are run and produce different simulation results.

Result providing module 238 may enable computing device 120 to provide simulation results to a user or device associated with the manufacturing tool. Providing the simulation results may involve presenting the simulation results, transmitting the simulation results, storing the results, or a combination thereof. Result providing module 238 may present the simulation results using a user interface (e.g., graphical user interface (GUI)) that displays one or more simulation results and details about the computer simulations (e.g., optimization values, number of simulations, value differences, best schedule). In one example, the user interface may include one or more display graphs that visually represent the simulation result as a schedule using one or more timelines (e.g., resource schedule, product schedule, task schedule). The display graphs (e.g., bar charts, Gantt charts) may include a graph organized by resource (e.g., resource graph) that includes a set of horizontal bars for a first resource and a set of horizontal bars for a second resource (e.g., first and second chambers). Each set of horizontal bars may represent time blocks that correspond to products that are processed by the respective resource. The display graphs may also or alternatively include a graph organized by product (e.g, product graph) that includes a set of horizontal bars for a first product and a set of horizontal bars for a second product (e.g., first and second wafers). Each set of horizontal bars may represent time blocks that correspond to resources processing the respective product. The user interface may also include one or more control elements that are configured to receive user input of a user (e.g., process engineer). The control elements may be used to select one or more of the simulation results to be used by the manufacturing tool (e.g., selection of an optimized schedule).

Result providing module 238 may also provide optimized data associated with one of the simulated results to the manufacturing tool. The optimized data may be related to optimized results 129 and may include one or more starting times, timelines, schedules, or other data. In one example, providing the optimized data to the manufacturing tool may involve establishing a communication channel with the manufacturing tool and using the communication channel to transmit the optimized data from computing device 120 to the manufacturing tool. In another example, providing the optimized data to the manufacturing tool may involve storing the optimized data in a data storage object and enabling the manufacturing tool to access the date storage object (e.g., storing on a network storage device).

Figure 3:
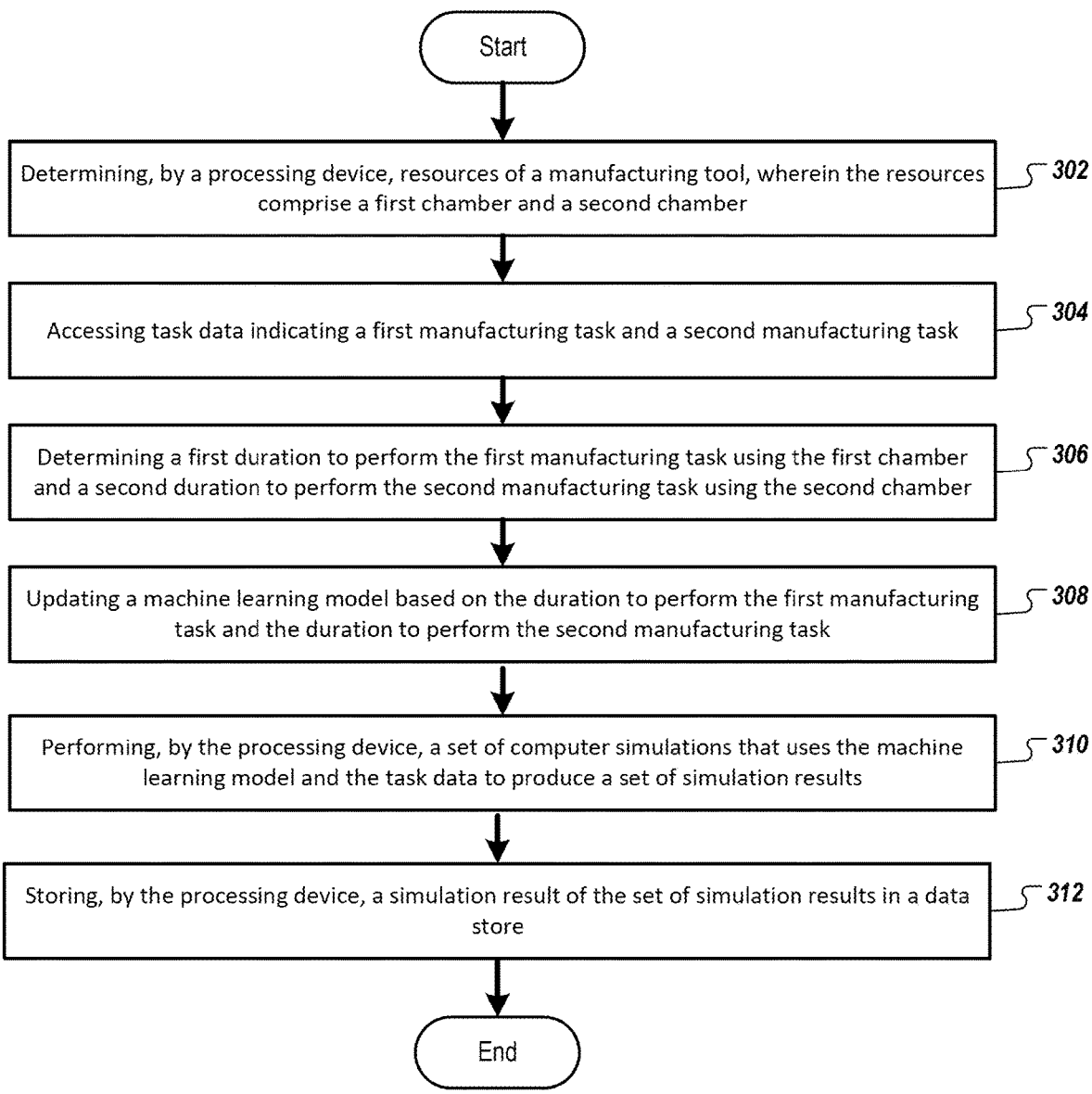
FIG. 3 is a flow diagram illustrating an example method for performing simulation-based optimization of a manufacturing process, according to certain embodiments.

FIG. 3 depicts a flow diagram of one illustrative example of a method 300 for performing a simulation based optimization to identify a schedule for a manufacturing tool, in accordance with one or more aspects of the present disclosure. Method 300 and each of its individual functions, routines, subroutines, or operations may be performed by one or more processors of the computer device executing the method. In certain implementations, method 300 may be performed by a single computing device. Alternatively, methods 300 may be performed by two or more computing devices, each computing device executing one or more individual functions, routines, subroutines, or operations of the method.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term "article of manufacture," as used herein, is intended to encompass a computer program accessible from any computer-readable device or storage media. In one implementation, method 300 may be performed by model creation component 220 and computer simulation component 230 as shown in FIG. 2.

Method 300 may be performed by processing devices of a server device or a client device and may begin at block 302. At block 302, a processing device may determine resources of a manufacturing tool. The resources may include a first chamber, a second chamber, and one or more additional chambers. The processing device may determine the resources by analyzing data of the manufacturing tool to identify a layout of the resources and to determine a type of each of the resources. In one example, the first chamber may be a modification chamber that modifies a product (e.g., an etching chamber) and the second chamber may be a movement chamber that moves the product (e.g., a robot chamber).

At block 304, the processing device may access task data indicating a first manufacturing task and a second manufacturing task. The task data may include a sequence of recipes to process a wafer product and the sequence of recipes may include a recipe for the first chamber and a recipe for the second chamber. The sequence of tasks may include a beginning task, a plurality of intermediate tasks, and an end task. One or more of the resources may be capable of performing the same task and each resource may be capable of performing one or more tasks.

At block 306, the processing device may determine a first duration to perform the first manufacturing task using the first chamber and a second duration to perform the second manufacturing task using the second chamber. The processing device may determine the durations by analyzing time data that was previously generated by the manufacturing tool while using the same task data or different task data to process a plurality of wafers. The time data may have been generated during a past manufacturing run (e.g., a historical run that has finished) or a current run (e.g., ongoing run that has not finished). In one example, the time data may include a plurality of times for the same manufacturing tool and the plurality of times may include one or more wafer load times, wafer processing times of the first chamber, wafer processing times of the second chamber, wafer transfer times between the first chamber and the second chamber, other times, or a combination thereof.

At block 308, the processing device may update a machine learning model based on the duration to perform the first manufacturing task and the duration to perform the second manufacturing task. The update may involve accessing time data for the manufacturing tool from a data store associated with the manufacturing tool and using the time data to train the machine learning model to temporally model the manufacturing tool. The trained machine learning model may then be stored in the manufacturing tool or on a device that is connected to the manufacturing tool over a computer network.

At block 310, the processing device may perform a set of computer simulations that uses the machine learning model and the task data to produce a set of simulation results. Performing the set of computer simulations may involve accessing the machine learning model to forecast the processing of a set of wafers. The processing device may perform the first computer simulation using a set of start times for the set of wafers and may detect that at least one wafer of the set is idle for a duration that exceeds a predefined threshold value (e.g., greater than n seconds). The processing device may modify the set of start times to include a different start time for the at least one wafer and perform a second computer simulation using the modified set of start times.

The processing device may also calculate an optimization value for the simulation results. The optimization value may be based on one or more of a wafer idle time, a chamber utilization, a tool throughput, or a combination thereof. The processing device may compare the optimization value to one or more optimization values of the set of simulation results and select the simulation result from the set of simulation results based on the comparing. In one example, the optimization value may be calculated in view of a set of intermediate tasks (e.g., wafer idle time during tasks C and F).

At block 312, the processing device may store a simulation result of the set of simulation results in a data store. The simulation result may be a set of resource vectors that includes a resource vector for each chamber of the manufacturing tool that is used to process the set of products. Each resource vector may include a plurality of time values and may represent a time line for a particular chamber that processes a plurality of products. In one example, the processing device may provide for display a Gantt chart representing the stored simulation result for the manufacturing tool. The Gantt chart may include a set of horizontal bars for the first chamber that represent time blocks for one or more wafers of a set and a set of horizontal bars for the second chamber that represent time blocks for one or more wafers of the set. Responsive to completing the operations described herein above with references to block 312, the method may terminate.

Figure 4:
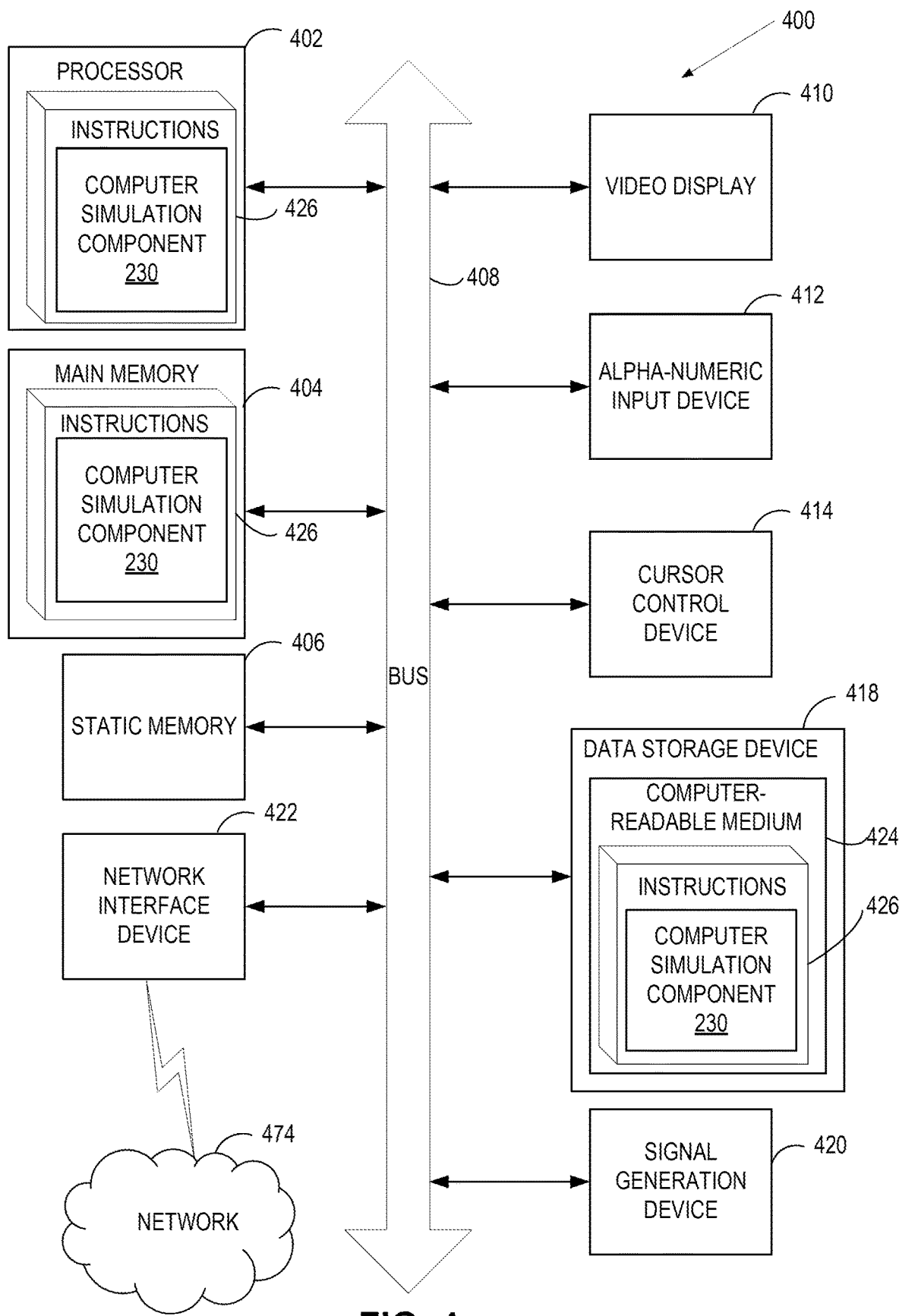
FIG. 4 is a block diagram illustrating a computer system, according to certain embodiments.

FIG. 4 is a block diagram illustrating a computer system 400, according to certain embodiments. In some embodiments, computer system 400 may be connected (e.g., via a network, such as a Local Area Network (LAN), an intranet, an extranet, or the Internet) to other computer systems. Computer system 400 may operate in the capacity of a server or a client computer in a client-server environment, or as a peer computer in a peer-to-peer or distributed network environment. Computer system 400 may be provided by a personal computer (PC), a tablet PC, a set-top box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 400 may include a processing device 402, a volatile memory 404 (e.g., random access memory (RAM)), a non-volatile memory 406 (e.g., read-only memory (ROM) or electrically-erasable programmable ROM (EEPROM)), and a data storage device 418, which may communicate with each other via a bus 408.

Processing device 402 may be provided by one or more processors such as a general purpose processor (such as, for example, a complex instruction set computing (CISC) microprocessor, a reduced instruction set computing (RISC) microprocessor, a very long instruction word (VLIW) microprocessor, a microprocessor implementing other types of instruction sets, or a microprocessor implementing a combination of types of instruction sets) or a specialized processor (such as, for example, an application specific integrated circuit (ASIC), a field programmable gate array (FPGA), a digital signal processor (DSP), or a network processor).

Computer system 400 may further include a network interface device 422 and a network 474. Computer system 400 also may include a video display unit 410 (e.g., an LCD), an alphanumeric input device 412 (e.g., a keyboard), a cursor control device 414 (e.g., a mouse), and a signal generation device 420.

In some implementations, data storage device 418 may include a non-transitory computer-readable storage medium 424 on which may store instructions 426 encoding any one or more of the methods or functions described herein, including instructions encoding the tool analysis component 210, model creation component 220, or computer simulation component 230 of FIG. 2 and for implementing methods described herein.

Instructions 426 may also reside, completely or partially, within volatile memory 404 and/or within processing device 402 during execution thereof by computer system 400, hence, volatile memory 404 and processing device 402 may also constitute machine-readable storage media.

While computer-readable storage medium 424 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "receiving," "determining," "selecting," "performing," "processing," "measuring," "reporting," "updating," "analyzing," "training," "creating," "adding," "calculating," "causing," "performing," "generating," "using," "modifying," "comparing," "accessing," "shifting," "storing," "detecting," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may include a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform methods described herein and/or each of their individual functions, routines, subroutines, or operations.

Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method comprising:
identifying, by at least one processing device, a set of wafers, wherein each wafer of the set of wafers is associated with a respective start time of a set of start times;
determining, by the at least one processing device, whether the set of wafers includes an idle wafer that is idle for a duration that exceeds a predefined threshold value;
in response to determining that the set of wafers includes an idle wafer that is idle for a duration that exceeds a predefined threshold value, generating, by the at least one processing device, a modified set of start times by modifying at least the start time for the idle wafer; and
initiating, by the at least one processing device, a computer simulation forecasting processing of the set of wafers using a wafer modification chamber and a wafer movement chamber based on the modified set of start times to obtain a first simulation result, wherein the computer simulation uses a machine learning model trained based on a first duration to perform a first manufacturing task using the wafer modification chamber and a second duration to perform a second manufacturing task using the wafer movement chamber.

2. The method of claim 1, further comprising analyzing, by the at least one processing device, time data generated by a manufacturing tool associated with the wafer modification chamber and the wafer movement chamber, wherein the time data is generated while a plurality of wafers is processed by the manufacturing tool in view of task data indicating the first manufacturing task and the second manufacturing task.

3. The method of claim 2, wherein the time data comprises a plurality of times for the manufacturing tool, and wherein the plurality of times comprises a plurality of wafer load times, wafer processing times of the wafer modification chamber, wafer processing times of the wafer movement chamber, and wafer transfer times between the wafer modification chamber and the wafer movement chamber.

4. The method of claim 1, further comprising:
accessing, by the at least one processing device, time data for a manufacturing tool from a data store associated with the manufacturing tool, wherein the manufacturing tool is associated with the wafer modification chamber and the wafer movement chamber; and
training, by the at least one processing device, the machine learning model using the time data.

5. The method of claim 1, wherein determining whether the set of wafers includes an idle wafer that is idle for a duration that exceeds a predefined threshold value further comprises initiating a second computer simulation using the set of start times for the set of wafers to obtain a second simulation result.

6. The method of claim 1, wherein the first simulation result comprises, for each of the wafer movement chamber and the wafer modification chamber, a respective resource vector, wherein each resource vector comprises a plurality of time values representing a processing timeline.

7. The method of claim 1, further comprising:
determining, by the at least one processing device, a first optimization value for the first simulation result that is based on one or more of a wafer idle time, a chamber utilization, or a tool throughput;
comparing, by the at least one processing device, the first optimization value to at least a second optimization value for at least a second simulation result; and
selecting, by the processing device based on the comparing, a simulation result from a set of simulation results comprising the first simulation result and at least the second simulation result.

8. The method of claim 7, further comprising identifying, by the at least one processing device, a sequence of tasks associated with first manufacturing task and the second manufacturing task, wherein the sequence of tasks comprises a beginning task, a set of intermediate tasks, and an end task, and wherein the second optimization value corresponds to the wafer idle time during at least one intermediate task of the set of intermediate tasks.

9. The method of claim 1, further comprising determining, by the at least one processing device, resources of a manufacturing tool comprising the wafer modification chamber and the wafer movement chamber, wherein determining the resources of the manufacturing tool comprises:
analyzing the manufacturing tool to identify a layout of the resources of the manufacturing tool; and
determining a type of each of the resources of the manufacturing tool.

10. The method of claim 1, further comprising identifying, by the at least one processing device, a sequence of wafer processing recipes associated with the first manufacturing task and the second manufacturing task, wherein the sequence of wafer processing recipes comprises a first recipe for the wafer modification chamber and a second recipe for the wafer movement chamber.

11. A system comprising:
a memory; and
a processing device communicably coupled to the memory, the processing device to:
identify a set of wafers, wherein each wafer of the set of wafers is associated with a respective start time of a set of start times;
determine whether the set of wafers includes an idle wafer that is idle for a duration that exceeds a predefined threshold value;
in response to determining that the set of wafers includes an idle wafer that is idle for a duration that exceeds a predefined threshold value, generate a modified set of start times by modifying at least the start time for the idle wafer; and
initiate a computer simulation forecasting processing of the set of wafers using a wafer modification chamber and a wafer movement chamber based on the modified set of start times to obtain a first simulation result, wherein the computer simulation uses a machine learning model trained based on a first duration to perform a first manufacturing task using the wafer modification chamber and a second duration to perform a second manufacturing task using the wafer movement chamber.

12. The system of claim 11, wherein the processing device is further to analyze time data generated by a manufacturing tool associated with the wafer modification chamber and the wafer movement chamber, and wherein the time data is generated while a plurality of wafers is processed by the manufacturing tool in view of task data indicating the first manufacturing task and the second manufacturing task.

13. The system of claim 12, wherein the time data comprises a plurality of times for the manufacturing tool, and wherein the plurality of times comprises a plurality of wafer load times, wafer processing times of the wafer modification chamber, wafer processing times of the wafer movement chamber, and wafer transfer times between the wafer modification chamber and the wafer movement chamber.

14. The system of claim 11, wherein the processing device is further to:
  access time data for a manufacturing tool from a data store associated with the manufacturing tool, wherein the manufacturing tool is associated with the wafer modification chamber and the wafer movement chamber; and
  train the machine learning model using the time data.

15. The system of claim 11, wherein, to determine whether the set of wafers includes an idle wafer that is idle for a duration that exceeds a predefined threshold value, the processing device is further to initiate a second computer simulation using the set of start times for the set of wafers to obtain a second simulation result.

16. The system of claim 11, wherein the first simulation result comprises, for each of the wafer movement chamber and the wafer modification chamber, a respective resource vector, wherein each resource vector comprises a plurality of time values representing a processing timeline.

17. The system of claim 11, wherein the processing device is further to:
  determine a first optimization value for the first simulation result that is based on one or more of a wafer idle time, a chamber utilization, or a tool throughput;
  compare the first optimization value to at least a second optimization value for at least a second simulation result; and
  select, based on the comparing, a simulation result from a set of simulation results comprising the first simulation result and at least the second simulation result.

18. The system of claim 17, wherein the processing device is further to identify a sequence of tasks associated with first manufacturing task and the second manufacturing task, wherein the sequence of tasks comprises a beginning task, a set of intermediate tasks, and an end task, and wherein the second optimization value corresponds to the wafer idle time during at least one intermediate task of the set of intermediate tasks.

19. The system of claim 11, wherein the processing device is further to determine resources of a manufacturing tool comprising the wafer modification chamber and the wafer movement chamber by:
  analyzing the manufacturing tool to identify a layout of the resources of the manufacturing tool; and
  determining a type of each of the resources of the manufacturing tool.

20. The system of claim 11, wherein the processing device is further to identify a sequence of wafer processing recipes associated with the first manufacturing task and the second manufacturing task, and wherein the sequence of wafer processing recipes comprises a first recipe for the wafer modification chamber and a second recipe for the wafer movement chamber.

* * * * *